United States Patent
Ishii

(10) Patent No.: US 9,911,759 B2
(45) Date of Patent: Mar. 6, 2018

(54) SEMICONDUCTOR DEVICE AND DISPLAY DEVICE

(71) Applicant: Japan Display Inc., Minato-ku (JP)

(72) Inventor: Tatsuya Ishii, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/201,809

(22) Filed: Jul. 5, 2016

(65) Prior Publication Data

US 2017/0033124 A1 Feb. 2, 2017

(30) Foreign Application Priority Data

Jul. 31, 2015 (JP) ................... 2015-151855

(51) Int. Cl.
*H01L 21/00* (2006.01)
*H01L 27/12* (2006.01)
*H01L 29/786* (2006.01)

(52) U.S. Cl.
CPC ........ *H01L 27/124* (2013.01); *H01L 27/1222* (2013.01); *H01L 27/1248* (2013.01); *H01L 29/78618* (2013.01); *H01L 29/78645* (2013.01)

(58) Field of Classification Search
CPC ............. H01L 27/124; H01L 29/78645; H01L 29/78618
See application file for complete search history.

(56) References Cited

U.S. PATENT DOCUMENTS

| 6,628,363 | B1* | 9/2003 | Sano | H01L 27/12 257/E27.111 |
| 7,122,835 | B1* | 10/2006 | Ikeda | G02F 1/13454 257/59 |
| 9,117,913 | B2* | 8/2015 | Inukai | H01L 27/1214 |
| 2017/0033124 | A1* | 2/2017 | Ishii | H01L 27/124 |
| 2017/0162640 | A1* | 6/2017 | Lee | H01L 27/3262 |
| 2017/0243896 | A1* | 8/2017 | Zhang | H01L 27/1222 |

FOREIGN PATENT DOCUMENTS

| JP | 8-125028 | 5/1996 | |
| JP | 2007-157989 | 6/2007 | |
| JP | 2008287151 A | * 11/2008 | |
| JP | 2017034060 A | * 2/2017 | ........... H01L 27/124 |

* cited by examiner

*Primary Examiner* — Laura Menz
(74) *Attorney, Agent, or Firm* — Oblon, McClelland, Maier & Neustadt, L.L.P.

(57) ABSTRACT

According to one embodiment, a semiconductor device includes first and second gate electrodes, a semiconductor layer, an output electrode, and an insulating layer. The semiconductor layer includes first source and drain areas, a first channel area facing the first gate electrode, second source and drain areas, and a second channel area facing the second gate electrode. The output electrode outputs voltage produced in the first and second drain areas. In the semiconductor device, the first drain area is in contact with the second drain area. The insulating layer includes a hole portion communicating with one of the first and second drain areas. The output electrode is in contact with one of the first and second drain areas via the hole portion.

7 Claims, 6 Drawing Sheets

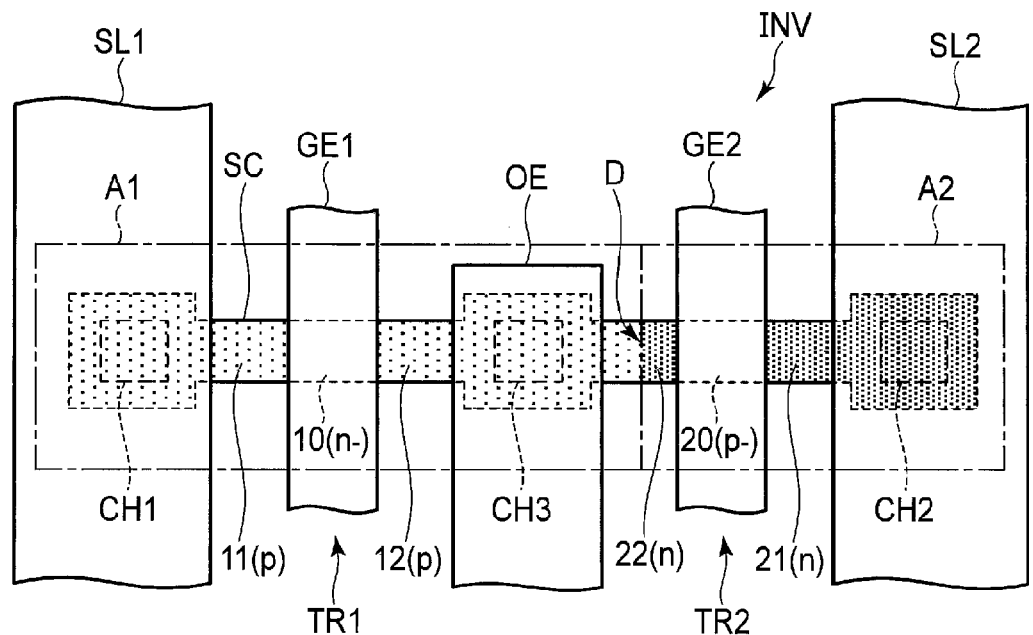
F I G. 8
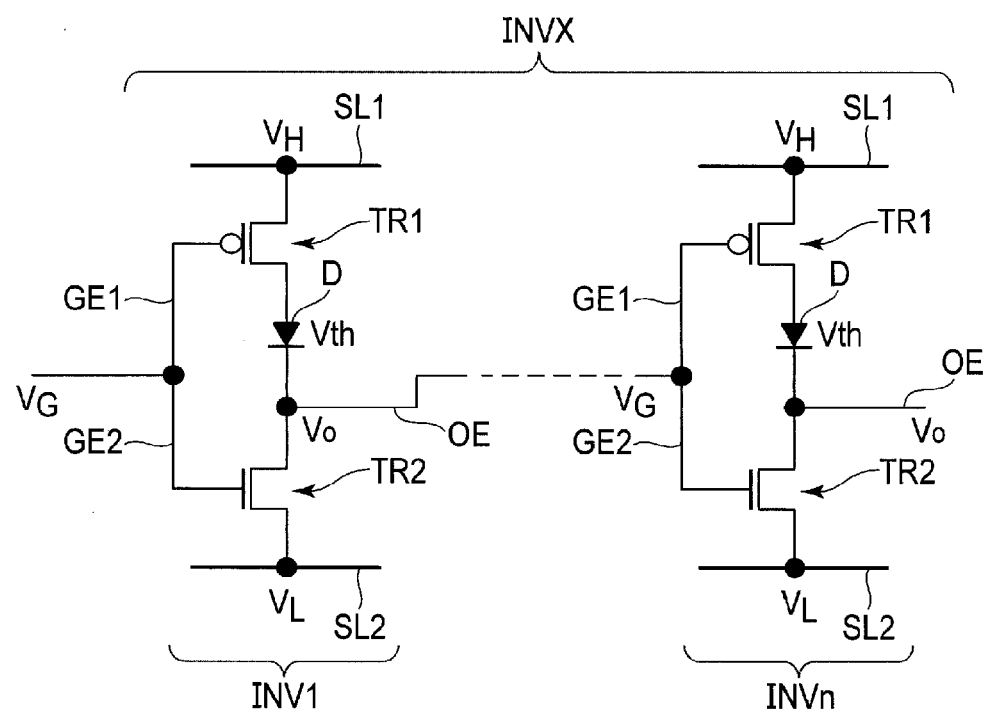
F I G. 9

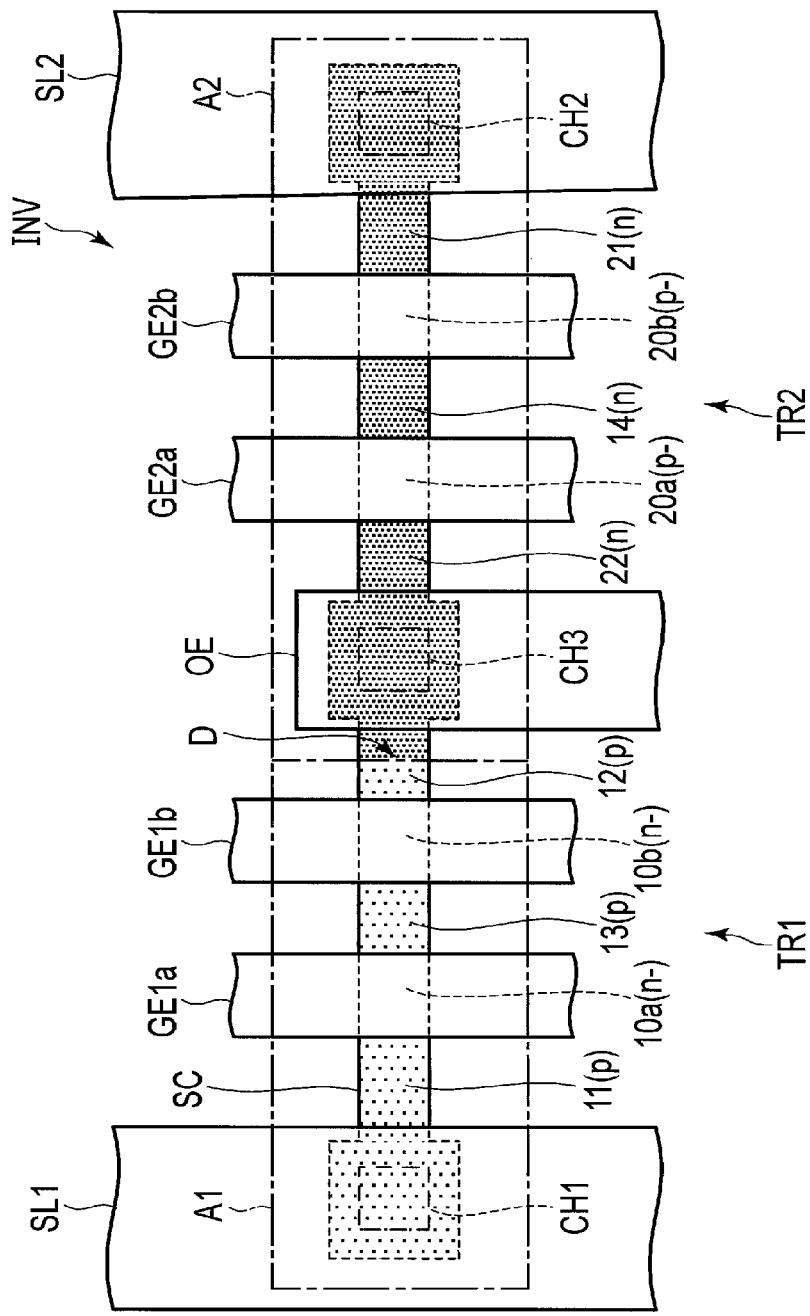
F I G. 10

SEMICONDUCTOR DEVICE AND DISPLAY DEVICE

CROSS-REFERENCE TO RELATED APPLICATIONS

This application is based upon and claims the benefit of priority from Japanese Patent Application No. 2015-151855, filed Jul. 31, 2015, the entire contents of which are incorporated herein by reference.

FIELD

Embodiments described herein relate generally to a semiconductor device and a display device.

BACKGROUND

Recently, display devices using, for example, liquid crystal display elements or organic electroluminescent display elements must exhibit a reduced frame area around the display area in which images are displayed.

In the frame area, peripheral circuits such as a driver for driving pixels provided in the display area are formed. The peripheral circuits comprise, for example, CMOS circuits including p- and n-type transistors. If the size of a semiconductor element such as a CMOS circuit is reduced, it is possible to reduce the frame area.

A small-sized semiconductor element may bring about favorable effects even when it is used for the circuit of other types of devices instead of the peripheral circuit of display devices. For example, the small-sized semiconductor element will reduce the size of the entire device.

BRIEF DESCRIPTION OF THE DRAWINGS

FIG. 8 is a plan view schematically showing a structural example of an inverter according to a second embodiment.

FIG. 9 shows an example of an equivalent circuit of a multistage inverter according to a third embodiment.

FIG. 10 schematically shows the structure of an inverter according to a modification example.

DETAILED DESCRIPTION

Figure 1:
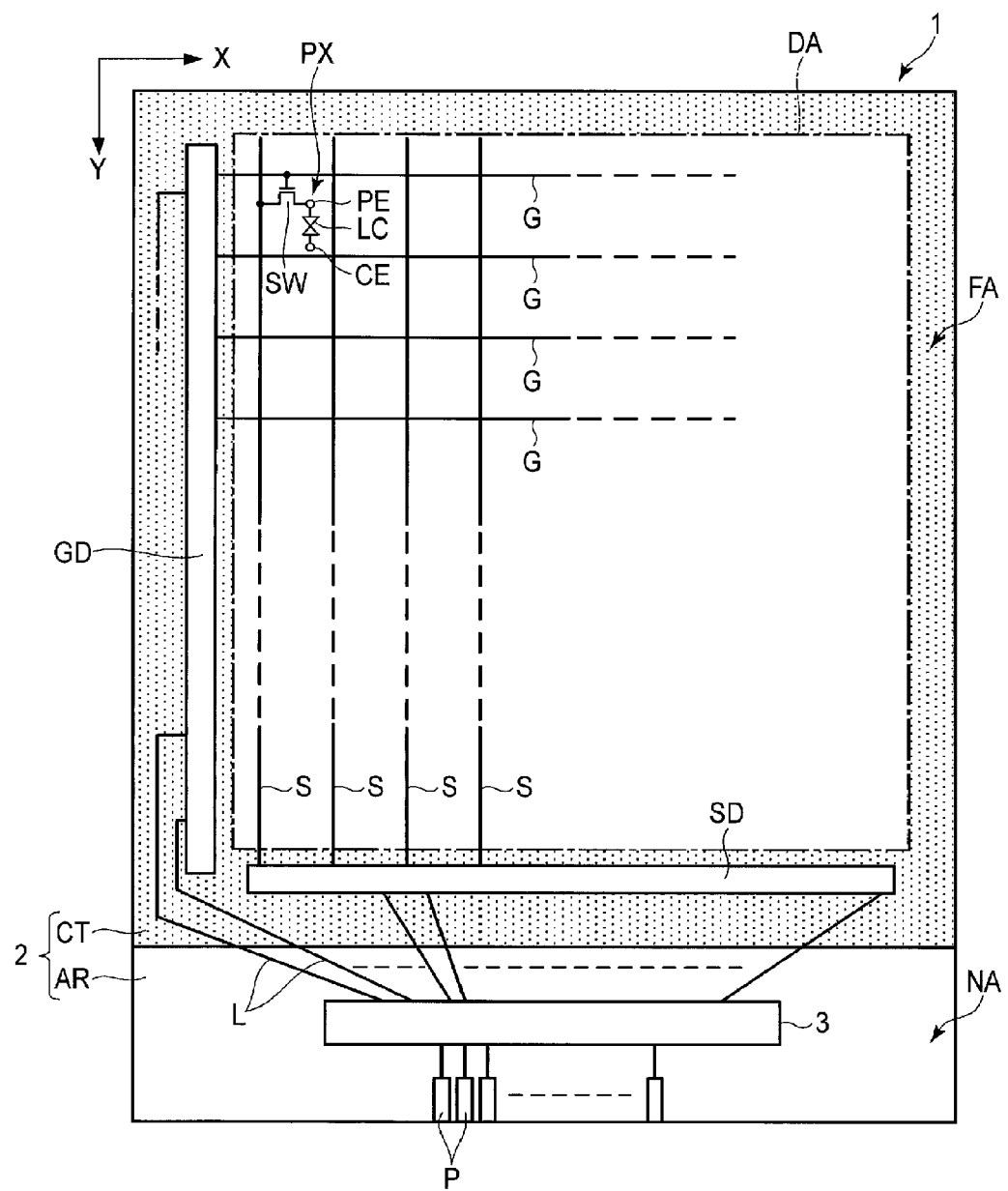
FIG. 1 is a plan view schematically showing the structure of a display device according to a first embodiment.

In general, according to one embodiment, a semiconductor device comprises a first gate electrode, a second gate electrode, a semiconductor layer, an output electrode and an insulating layer. The semiconductor layer comprises first source and drain areas of a p-type transistor, a first channel area which is provided between the first source area and the first drain area and faces the first gate electrode, second source and drain areas of an n-type transistor, and a second channel area which is provided between the second source area and the second drain area and faces the second gate electrode. The output electrode outputs voltage produced in the first drain area and the second drain area. The insulating layer is provided between the semiconductor layer and the output electrode. In the semiconductor device, the first drain area is in contact with the second drain area. The insulating layer comprises a hole portion communicating with one of the first and second drain areas. The output electrode is in contact with one of the first and second drain areas via the hole portion.

According to another embodiment, a display device comprises a switching element provided for each pixel in a display area in which an image is displayed, a line connected to the switching element, and the semiconductor device connected to the line outside the display area.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In the drawings, reference numbers of continuously arranged elements equivalent or similar to each other are omitted in some cases. In addition, in the specification and drawings, structural elements which function in the same or a similar manner to those described in connection with preceding drawings are denoted by like reference numbers, detailed description thereof being omitted unless necessary.

In each embodiment, a display device comprising a display panel using a liquid crystal display element is disclosed as an example of the display device. However, the embodiments do not preclude the application of individual technical ideas disclosed in the embodiments to a display device using a display element other than a liquid crystal display element. As this type of display device, for example, a self-luminous display device comprising an organic electroluminescent display element, and an electronic-paper type display device comprising a cataphoretic element can be considered.

First Embodiment

A first embodiment is explained.

FIG. 1 is a plan view schematically showing the structure of a display device 1 according to the present embodiment. The display device 1 comprises a display panel 2 including an array substrate (first substrate) AR and a counter-substrate (second substrate) CT. In the example of FIG. 1, the array substrate AR is larger than the counter-substrate CT. The array substrate AR and the counter-substrate CT are attached to each other such that three sides are matched.

In the area in which the array substrate AR overlaps the counter-substrate CT, the display panel 2 comprises a display area DA in which pixels PX are formed for displaying an image, and a surrounding area (frame area) FA around the display area DA. The display panel 2 further comprises a non-overlapping area (terminal area) NA in which the array substrate AR does not overlap the counter-substrate CT. For example, a plurality of pixels PX corresponding to different colors constitute one pixel for color display. The pixels PX may be called sub-pixels.

In the display area DA, the array substrate AR comprises a plurality of scanning lines G which extend in a first direction X and are arranged in a second direction Y, and a plurality of signal lines S which extend in the second direction Y and are arranged in the first direction X. Each pixel PX is sectionalized by, for example, two adjacent scanning lines G and two adjacent signal lines S.

In each pixel PX, the array substrate AR comprises a switching element SW electrically connected to a corresponding scanning line G and a corresponding signal line S, and a pixel electrode PE electrically connected to the switching element SW. The pixel electrode PE forms an electric field for driving a liquid crystal layer LC between the pixel electrode PE and a common electrode CE provided in common with a plurality of pixels PX. The common electrode CE may be provided on either the counter-substrate CT or the array substrate AR. The liquid crystal layer LC is enclosed between the array substrate AR and the counter-substrate CT.

Furthermore, the array substrate AR comprises a gate driver GD electrically connected to each scanning line G, and a source driver SD electrically connected to each signal line S. In the example of FIG. 1, the gate driver GD is provided in the surrounding area FA along one of the sides of the display area DA in the second direction Y. The source driver SD is provided between the display area DA and the non-overlapping area NA in the surrounding area FA. The gate driver GD and the source driver SD may be provided on the display panel 2 with a different form. For example, the gate driver GD may be provided on both sides of the display area DA. In this case, even-numbered scanning lines G from the non-overlapping area NA side may be connected to one gate driver GD, and odd-numbered scanning lines G may be connected to the other gate driver GD.

A driver IC 3 which functions as a display driver is mounted in the non-overlapping area NA. The driver IC 3 is electrically connected to the gate driver GD and the source driver SD through a plurality of connection lines L.

Moreover, a plurality of connection terminals P electrically connected to the driver IC 3 are formed in the non-overlapping area NA. A flexible wiring board is connected to the connection terminals P in order to connect the display device 1 to the main board of an electronic device in which the display device 1 is mounted, etc.

Figure 2:
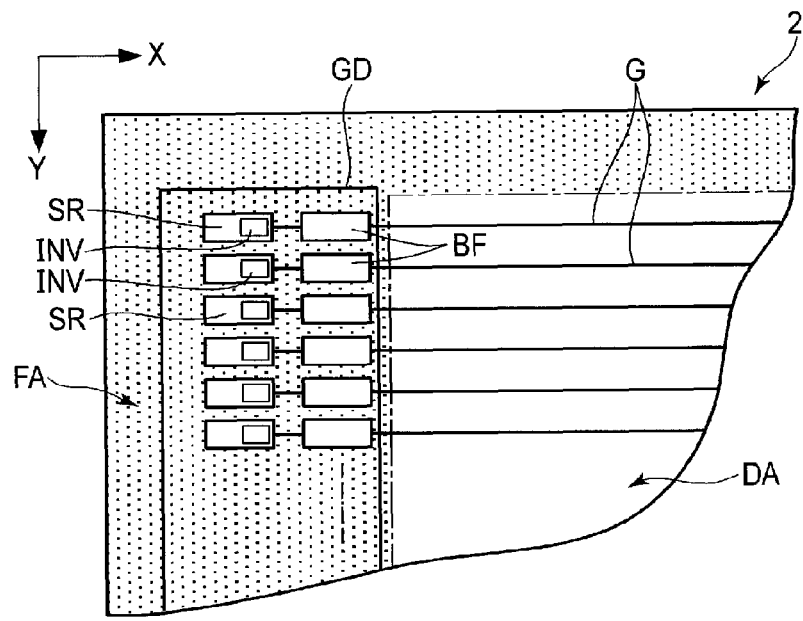
FIG. 2 shows an enlarged view of a part of a display panel provided in the display device according to the first embodiment.

FIG. 2 shows an enlarged view of a part of the display panel 2. The gate driver GD comprises buffers BF which sequentially supply scanning signals to the scanning lines G. One buffer BF is provided for each scanning line G. In the example of FIG. 2, the buffers BF are arranged in the second direction Y.

The gate driver GD comprises shift registers SR in addition to the buffers BF. One shift register SR is provided for each buffer BF. The gate driver GD uses the shift registers SR in order to supply, to the buffers BF, control signals for supplying scanning signals to the scanning lines G.

Each shift register SR includes at least one inverter INV. The inverter INV disclosed in the present embodiment is an example of the semiconductor device. All of the elements provided in the gate driver GD including the inverters INV are formed in the surrounding area FA in the manufacturing process of the elements of the display area DA such as the switching elements SW together with the elements of the display area DA.

Figure 3:
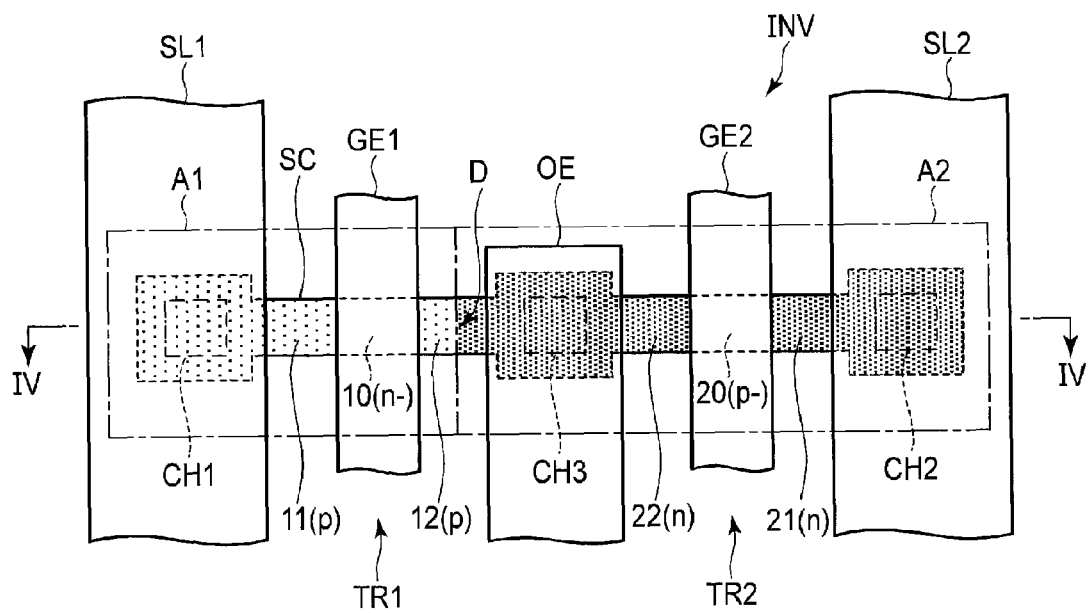
FIG. 3 is a plan view schematically showing a structural example of an inverter according to the first embodiment.
Figure 4:
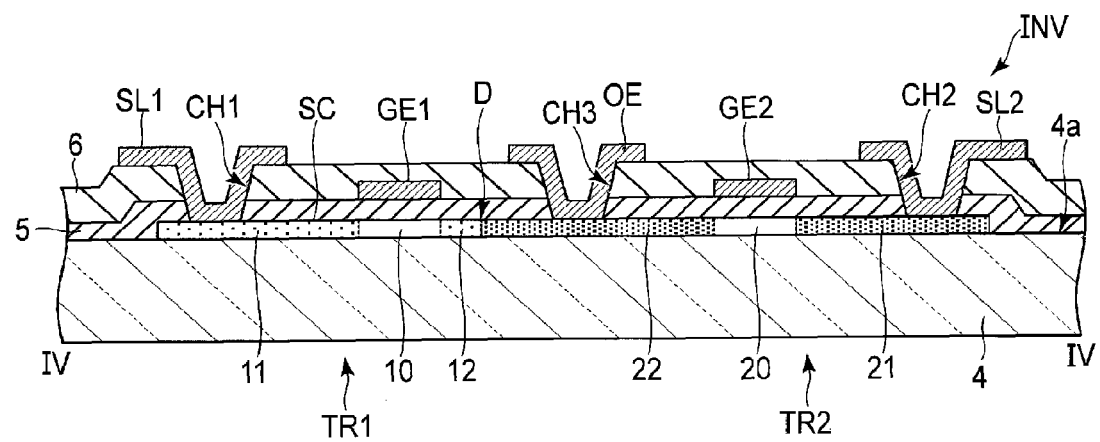
FIG. 4 schematically shows an example of the cross-sectional surface taken along line IV-IV shown in FIG. 3.

The structure of each inverter INV is explained with reference to FIG. 3 and FIG. 4. FIG. 3 is a plan view schematically showing a structural example of each inverter INV. FIG. 4 schematically shows an example of the cross-sectional surface taken along line IV-IV shown in FIG. 3.

As shown in FIG. 3 and FIG. 4, the inverter INV comprises a semiconductor layer SC, a first gate electrode GE1, a second gate electrode GE2, a first line SL1, a second line SL2 and an output electrode OE.

As shown in FIG. 4, for example, the semiconductor layer SC is formed on a main surface 4a of an insulating substrate 4 which is a glass substrate. The main surface 4a faces the counter-substrate CT. The switching element SW and the pixel electrode PE shown in FIG. 1 are formed above the main surface 4a. The semiconductor layer SC may be formed of, for example, amorphous silicon or polysilicon. Another layer may be interposed between the semiconductor layer SC and the main surface 4a of the insulating substrate 4.

The semiconductor layer SC is covered by a first insulating layer 5 which functions as a gate insulating film. The first gate electrode GE1 and the second gate electrode GE2 are formed on the first insulating layer 5 and face the semiconductor layer SC. The first gate electrode GE1 and the second gate electrode GE2 are covered by a second insulating layer 6 formed on the first insulating layer 5.

The semiconductor layer SC comprises a first channel area 10 facing the first gate electrode GE1, and a second channel area 20 facing the second gate electrode. The semiconductor layer SC further comprises a first source area 11 and a first drain area 12. The first channel area 10 is interposed between the first source area 11 and the first drain area 12. The semiconductor layer SC further comprises a second source area 21 and a second drain area 22. The second channel area 20 is interposed between the second source area 21 and the second drain area 22.

In the examples of FIG. 3 and FIG. 4, both the first drain area 12 and the second drain area 22 are formed between the first channel area 10 and the second channel area 20. The first drain area 12 is in contact with the second drain area 22.

For example, the first source area 11 and the first drain area 12 are doped with first conductive impurity ions by implanting the ions into a first diffusion area A1 shown by chain lines in FIG. 3. For example, the second source area 21 and the second drain area 22 are doped with second conductive impurity ions by implanting the ions into a second diffusion area A2 shown by two-dot chain lines in FIG. 3.

In the present embodiment, the first and second conductive impurity ions are assumed to be p- and n-type impurity ions, respectively. As p-type impurity ions boron (B) ions may, for example, be used. As n-type impurity ions phosphorous (P) ions may, for example, be used. For example, the first channel area 10 is doped with n-type impurity ions at low concentration (n-). The second channel area 20 is doped with p-type impurity ions at low concentration (p-).

Since the first drain area 12 is in contact with the second drain area 22, a diode D is formed by a p-n junction in the boundary between the first drain area 12 and the second drain area 22.

The first line SL1 is in contact with the first source area 11 via a first contact hole CH1 penetrating the first and second insulating layers 5 and 6. The second line SL2 is in contact with the second source area 21 via a second contact hole CH2 penetrating the first and second insulating layers 5 and 6. The output electrode OE is in contact with the second drain area 22 via a third contact hole CH3 penetrating the first and second insulating layers 5 and 6. The third contact hole CH3 is an example of the hole portion.

The first gate electrode GE1, the second gate electrode GE2, the first line SL1 and the second line SL2 are, for example, metal lines having a single-layer or stacked-layer structure. As the stacked-layer structure, for example, a NAM or TAT structure can be considered. MAN stands for molybdenum (Mo)/aluminum (Al)/Mo. In this structure, an Al layer which is easy to oxidize is interposed between Mo layers which are difficult to oxidize. TAT stands for titanium (Ti)/Al/Ti. In this structure, an Al layer which is easy to oxidize is interposed between Ti layers which are difficult to oxidize. For an Al layer, an aluminum alloy such as an aluminum-neodymium (Al—Nd) alloy may be used.

In the inverter INV having the above structure, a first transistor TR1 having the first conductive type (p-type) is formed by the first channel area 10, the first source area 11, the first drain area 12, the first gate electrode GE1 and the first line SL1. Further, a second transistor TR2 having the second conductive type (n-type) is formed by the second channel area 20, the second source area 21, the second drain area 22, the second gate electrode GE2 and the second line SL2. The first line SL1 functions as the source electrode of the first transistor TR1. The second line SL2 functions as the source electrode of the second transistor TR2. Moreover, the output electrode OF functions as the common drain electrode of the first and second transistors TR1 and TR2.

Figure 5:
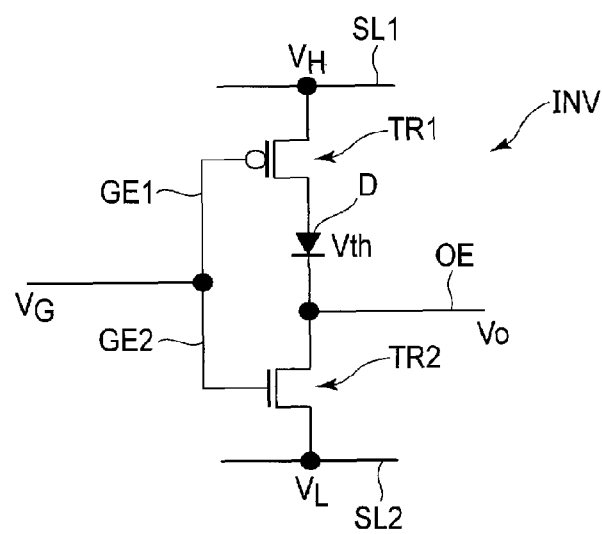
FIG. 5 shows an example of an equivalent circuit of the inverter according to the first embodiment.

Now, this specification explains the operation of the inverter INV. FIG. 5 shows an example of the equivalent circuit of the inverter INV. In the circuit structure of the inverter INV of the present embodiment, the first transistor TR1 is connected to the second transistor TR2 in series. The output electrode OF is provided between the first and second transistors TR1 and TR2. The diode D is provided between the output electrode OF and the first transistor TR1.

A first voltage $V_H$ is supplied to the first line SL1. A second voltage $V_L$ less than the first voltage $V_H$ is supplied to the second line SL2 ($V_H > V_L$). The threshold voltage of the diode D is $V_{th}$. The same gate voltage $V_G$ is supplied to the first and second gate electrodes GE1 and GE2. For example, the gate voltage $V_G$ is swung between the first voltage $V_H$ and the second voltage $V_L$. An output voltage $V_O$ is obtained from the output electrode OE based on the change in the gate voltage $V_G$.

Figure 6:
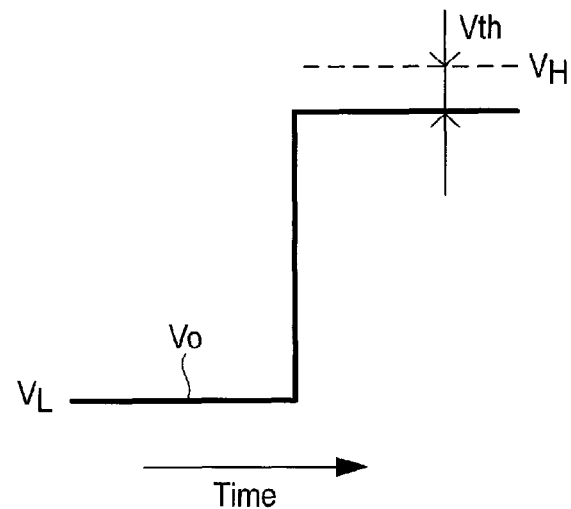
FIG. 6 shows the change in the output voltage of the inverter according to the first embodiment.

FIG. 6 shows the change in the output voltage $V_O$ of the output electrode OE. When the gate voltage $V_G$ is the first voltage $V_H$, the first transistor TR1 is in an off-state, and the second transistor TR2 is in an on-state. In this case, the output voltage $V_O$ is substantially equal to the second voltage $V_L$.

When the gate voltage $V_G$ is the second voltage $V_L$, the first transistor TR1 is in an on-state, and the second transistor TR2 is in an off-state. In this case, the output voltage $V_O$ is substantially equal to a value obtained by subtracting the threshold voltage $V_{th}$ of the diode D from the first voltage $V_H$.

For example, a buffer BF connected to a scanning line G is connected to an output electrode OE directly or via another circuit element. In other words, a scanning line G is connected to an output electrode OE via a buffer BF, etc. Thus, the voltage of each scanning line G changes based on the output voltage $V_O$. The switching element SW of each pixel PX is selectively turned on and off based on the change in the voltage of the scanning line G and a video signal supplied to the signal line S. In this manner, an image is displayed in the display area DA.

In the present embodiment explained above, the first and second transistors TR1 and TR2 are formed by the single semiconductor layer SC. Further, the first and second transistors TR1 and TR2 are connected to the output electrode OE via the single third contact hole CH3. This structure allows each inverter INV to be reduced in size in comparison with a case where the first and second transistors TR1 and TR2 are formed by separate semiconductor layers, or a case where the transistors are formed by the same semiconductor layer and connected to the output electrode OE via separate contact holes. Moreover, the gate driver GD can be reduced in size by using the downsized inverters INV. Thus, the surrounding area FA can be also reduced.

Figure 7:
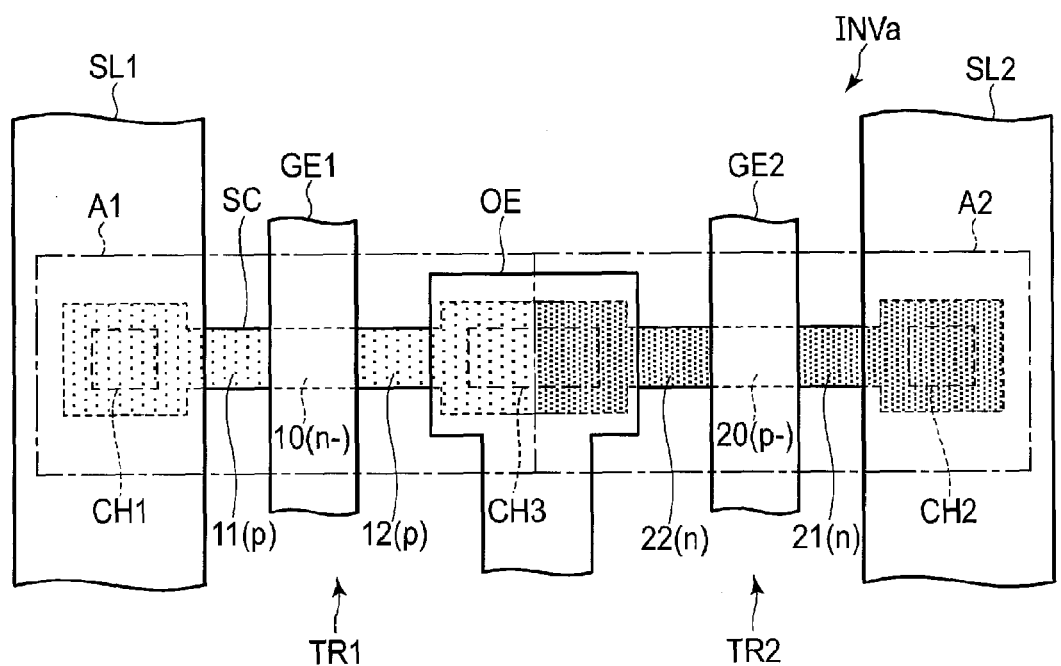
FIG. 7 shows a comparative example of the first embodiment.

For comparison, an inverter INVa having a structure different from that of the present embodiment is shown in FIG. 7. The inverter INVa shown in FIG. 7 is different from each inverter INV of the present embodiment in terms of the following structures. The third contact hole CH3 communicates with both the first drain area 12 and the second drain area 22. Further, the output electrode OE is in contact with both the first drain area 12 and the second drain area 22 via the third contact hole CH3.

In general, to reduce the contact resistance between the drain area and the output electrode, there is a need to increase the area in which the drain area is in contact with the output electrode. To decrease the contact resistance in the inverter INVa shown in FIG. 7, it is necessary to increase the area in which the first drain area 12 is in contact with the output electrode OE, and the area in which the second drain area 22 is in contact with the output electrode OE. In this case, the opening area of the third contact hole CH3 is approximately twice the opening area of a case where the output electrode OE is connected to the first drain area 12 or the second drain area 22 independently.

Further, in the inverter INVa shown in FIG. 7, when a region in which p- and n-types are mixed is formed in the boundary between the first and second drain areas 12 and 22, this region is nearly in the state of an intrinsic semiconductor. Thus, the contact resistance is increased. To avoid this situation, the area in which the output electrode OF is in contact with the first and second drain areas 12 and 22 need to be further increased.

In each inverter INV of the present embodiment, the output electrode OE is in contact with only the second drain area 22. In this case, unlike the comparative example of FIG. 7, it is possible to realize a low contact resistance between the output electrode OE and the second drain area 22 without increasing the opening area of the third contact hole CH3 or the contact area. Thus, each inverter INV of the present embodiment is more advantageous than that of the comparative example shown in FIG. 7 in terms of the reduced size.

In addition to the above explanation, various excellent effects can be obtained from the present embodiment.

Second Embodiment

A second embodiment is explained. This section mainly looks at differences from the first embodiment. Redundant explanations may be omitted to avoid overlap with the first embodiment.

FIG. 8 is a plan view schematically showing a structural example of an inverter INV according to the present embodiment. In this inverter INV, a third contact hole CH3 communicates with a first drain area 12. Further, an output electrode OE is in contact with the first drain area 12 via the third contact hole CH3.

In the structure of FIG. 8, a diode D formed by a p-n junction between the first drain area 12 and a second drain area 22 is located between the output electrode OE and a second transistor TR2. Thus, when the gate voltage $V_G$ is a first voltage $V_H$, the output voltage $V_O$ is substantially equal to a value obtained by adding the threshold voltage $V_{th}$ of the diode D to a second voltage $V_L$. When the gate voltage $V_G$ is the second voltage $V_L$, the output voltage $V_O$ is substantially equal to the first voltage $V_H$.

In a manner similar to that of the first embodiment, each inverter INV can be reduced in size in the present embodiment. Moreover, a gate driver GD can be reduced in size by using the downsized inverters INV. Thus, a surrounding area FA can be also decreased.

Third Embodiment

A third embodiment is explained. The present embodiment discloses a multistage inverter formed by using the inverters INV described in the first embodiment. The multistage inverter is an example of the multistage semiconductor device. Each inverter INV is an example of the semiconductor device.

FIG. 9 shows an example of the equivalent circuit of a multistage inverter INVX. The multistage inverter INVX comprises a plurality of inverters INV1 to INVn, where n is an integer greater than or equal to two.

Inverters INV1 to INVn each have the same structure as each inverter INV disclosed in the first embodiment. Inverter INV1 is located in the very front stage, and inverter INVn is located in the last stage. The output electrode OE of the inverter INV located in an anterior stage is connected to the first and second gate electrodes GE1 and GE2 of the inverter INV located in the next stage. Thus, the output voltage $V_O$ of the inverter INV located in the anterior stage is the gate voltage $V_G$ of the inverter INV located in the next stage. For example, a buffer BF is connected to the output electrode OE of inverter INVn directly or via another circuit element.

In this structure, the gate voltage $V_G$ is swung between a second voltage $V_L$ and a value obtained by subtracting a threshold voltage $V_{th}$ from a first voltage $V_H$, excluding inverter INV1 located in the very front stage. In general, the threshold voltage $V_{th}$ of a diode D formed by a p-n junction is sufficiently less than the threshold voltage for turning on and off first and second transistors TR1 and TR2. Thus, neither the first transistor TR1 nor the second transistor TR2 is operated incorrectly by the threshold voltage $V_{th}$.

All of inverters INV1 to INVn may be the inverters INV disclosed in the second embodiment. Alternatively, one or more of inverters INV1 to INVn may be the inverters INV disclosed in the second embodiment.

One or more of inverters INV1 to INVn may be different from the inverters of the first and second embodiments. For example, one or more of inverters INV1 to INVn may be the inverters INVa shown in the comparative example of FIG. 7. For example, it is possible to eliminate an effect to be caused by the threshold voltage $V_{th}$ on the output voltage $V_O$ of the multistage inverter INVX (in other words, the output voltage $V_O$ of inverter INVn) when inverter INVn located in the last stage does not comprise the diode D in a manner similar to that of each inverter INVa.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the structures of the semiconductor layer SC, the third contact hole CH3 and the output electrode OE disclosed in the first and second embodiments may be applied to semiconductor devices other than inverters, for example, the output terminal of a logic circuit in which the direction of current is constant, such as a NAND, NOR, AND, OR or XOR circuit. Semiconductor devices such as inverters or the above logic circuits may be used for not only the gate driver GD but also other elements of the display device 1, for example, the source driver SD.

In the first and second embodiments, the first and second transistors TR1 and TR2 are top-gate transistors. However, the first and second transistors TR1 and TR2 may be bottom-gate transistors in which the first gate electrode GE1, the second gate electrode GE2 and the first insulating layer 5 are provided on the insulating substrate 4 side.

In the first and second embodiments, the first and second transistors TR1 and TR2 are single-gate transistors. However, the first and second transistors TR1 and TR2 may be double-gate transistors in which the first and second gate electrodes GE1 and GE2 intersect with the semiconductor layer Sc twice in a planar view.

As an example of this structure, this specification explains the structure of an inverter INV when the first and second transistors TR1 and TR2 of the first embodiment are double-gate transistors, referring to FIG. 10. The inverter INV shown in FIG. 10 is different from that shown in FIG. 3 in respect that the inverter INV comprises two first gate electrodes GE1a and GE1b and two second gate electrodes GE2a and GE2b.

A semiconductor layer SC comprises a first channel area 10a facing first gate electrode GE1a, a first channel area 10b facing first gate electrode GE1b, a second channel area 20a facing second gate electrode GE2a, and a second channel area 20b facing second gate electrode GE2b. A first intermediate area 13 is formed between first channel areas 10a and 10b. A second intermediate area 14 is formed between second channel areas 20a and 20b.

In a manner similar to that of the example of FIG. 10, the first and second transistors TR1 and TR2 of the second embodiment may be double-gate transistors.

What is claimed is:

1. A display device comprising:
   a switching element provided for each pixel in a display area in which an image is displayed;
   a line connected to the switching element; and
   a semiconductor device connected to the line outside the display area, wherein
   the semiconductor device comprises:
   a first gate electrode and a second gate electrode;
   a semiconductor layer comprising:
   first source and drain areas of a p-type transistor;
   a first channel area which is provided between the first source area and the first drain area, and faces the first gate electrode;
   second source and drain areas of an n-type transistor; and
   a second channel area which is provided between the second source area and the second drain area, and faces the second gate electrode;
   an output electrode which outputs voltage produced in the first drain area and the second drain area to the line; and an insulating layer provided between the semiconductor layer and the output electrode, the first drain area is in contact with the second drain area, the insulating layer comprises a hole portion communicating with one of the first and second drain areas, and the output electrode is in contact with one of the first and second drain areas via the hole portion.

2. The display device of claim 1, wherein the hole portion communicates with the second drain area, and the output electrode is in contact with the second drain area via the hole portion.

3. The display device of claim 2, wherein a diode is provided between the output electrode and the first drain area.

4. The display device of claim 1, wherein the hole portion communicates with the first drain area, and the output electrode is in contact with the first drain area via the hole portion.

5. The display device of claim 4, wherein a diode is provided between the output electrode and the second drain area.

6. The display device of claim 1, comprising a pair of first gate electrodes, wherein the semiconductor layer comprises:

a pair of first channel areas which is provided between the first source area and the first drain area, and faces the respective first gate electrodes; and a first intermediate area provided between the first channel areas.

7. The display device of claim 1, comprising a pair of second gate electrodes, wherein the semiconductor layer comprises:

a pair of second channel areas which is provided between the second source area and the second drain area, and faces the respective second gate electrodes; and a second intermediate area provided between the second channel areas.

\* \* \* \* \*